(12) United States Patent
Wong et al.

(10) Patent No.: US 8,287,642 B2
(45) Date of Patent: Oct. 16, 2012

(54) DEVICES AND METHODS FOR PROVIDING STIMULATED RAMAN LASING

(75) Inventors: Chee Wei Wong, New York, NY (US);
James F. McMillan, New York, NY (US); Xiaodong Yang, New York, NY (US); Richard Osgood, Jr., Chappaqua, NY (US); Jerry Dadap, Red Bank, NJ (US); Nicolae Panoiu, Bronx, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 150 days.

(21) Appl. No.: 12/948,706

(22) Filed: Nov. 17, 2010

(65) Prior Publication Data

US 2011/0147344 A1     Jun. 23, 2011

Related U.S. Application Data

(62) Division of application No. 12/065,406, filed as application No. PCT/US2006/034171 on Aug. 31, 2006, now Pat. No. 7,869,470.

(60) Provisional application No. 60/712,413, filed on Aug. 31, 2005.

(51) Int. Cl.
    *C30B 29/06*          (2006.01)

(52) U.S. Cl. .......... 117/2; 117/3; 117/8; 117/9; 117/935

(58) Field of Classification Search .............. 117/2, 3, 117/8, 9, 935
See application file for complete search history.

(56) References Cited

U.S. PATENT DOCUMENTS

| | | | |
|---|---|---|---|
| 6,430,936 B1 * | 8/2002 | Ghoshal | 62/3.7 |
| 6,711,200 B1 * | 3/2004 | Scherer et al. | 372/64 |
| 6,798,947 B2 * | 9/2004 | Iltchenko | 385/31 |
| 7,259,855 B2 * | 8/2007 | Fan et al. | 356/436 |
| 7,346,251 B2 * | 3/2008 | Bose et al. | 385/129 |
| 2003/0035227 A1 * | 2/2003 | Tokushima | 359/737 |

* cited by examiner

*Primary Examiner* — Bob M Kunemund
(74) *Attorney, Agent, or Firm* — Lisa A. Chiarini; Hughes Hubbard & Reed LLP

(57) ABSTRACT

Devices and methods for providing stimulated Raman lasing are provided. In some embodiments, devices include a photonic crystal that includes a layer of silicon having a lattice of holes and a linear defect that forms a waveguide configured to receive pump light and output Stokes light through Raman scattering, wherein the thickness of the layer of silicon, the spacing of the lattice of holes, and the size of the holes are dimensioned to provide Raman lasing. In some embodiments, methods include forming a layer of silicon, and etching the layer of silicon to form a lattice of holes with a linear defect that forms a waveguide configured to receive pump light and output Stokes light through Raman scattering, wherein the thickness of the layer of silicon, the spacing of the lattice of holes, and the size of the holes are dimensioned to provide Raman lasing.

9 Claims, 12 Drawing Sheets

Fig. 2 Projected band diagram of PhC waveguide

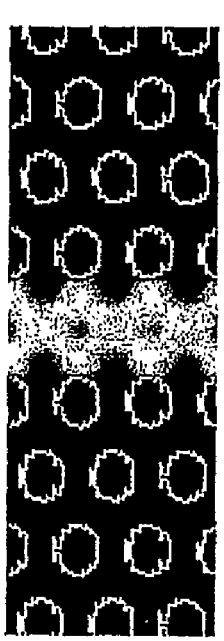 $|E|^2$ 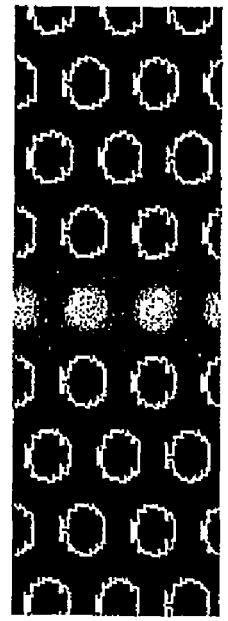 $|H|^2$
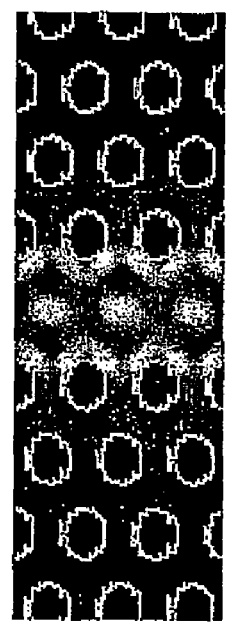 $|E|^2$ 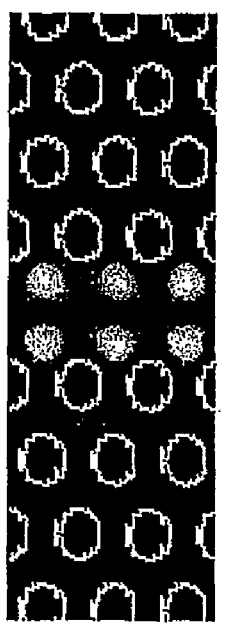 $|H|^2$
Fig. 5

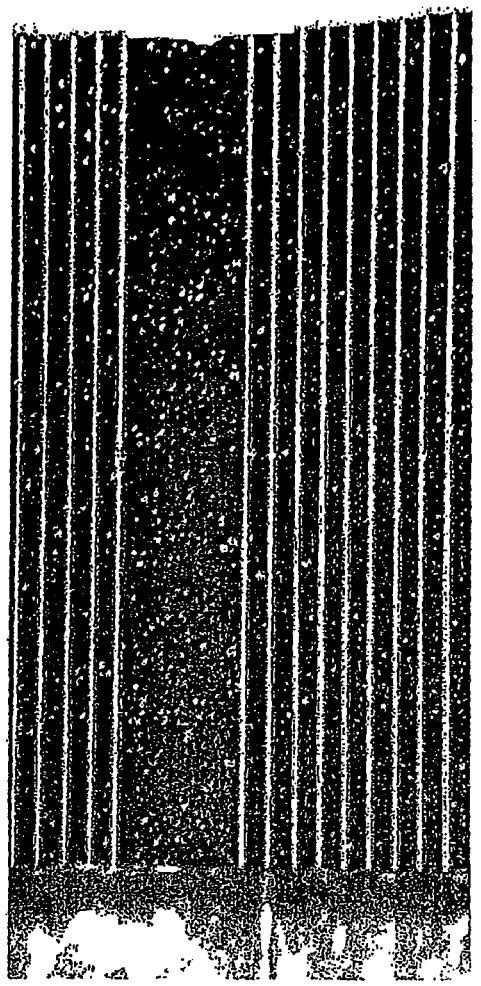
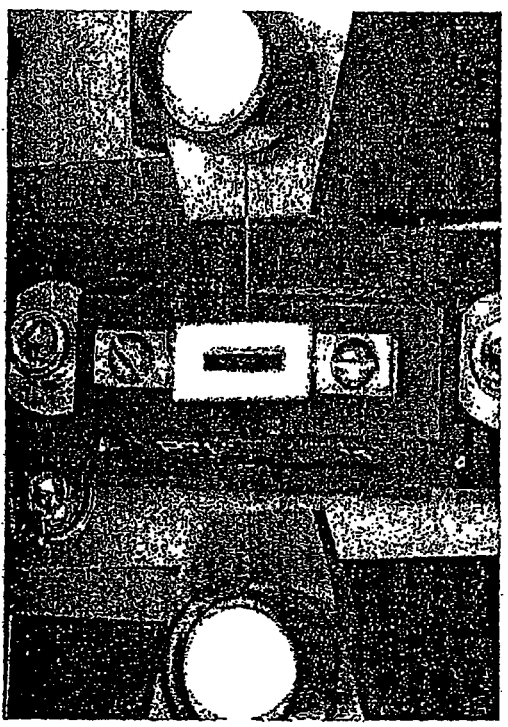
Fig. 7

| Scheme | $v_g^s$ | $v_g^p$ | K (×10⁻¹⁹) |
|---|---|---|---|
| 1 | 0.02c | 0.01c | 0.55 |
| 2 | 0.02c | 0.30c | 2.02 |

Fig. 12

DEVICES AND METHODS FOR PROVIDING STIMULATED RAMAN LASING

CROSS-REFERENCE TO RELATED APPLICATIONS

This application is a divisional application of U.S. application Ser. No. 12/065,406, filed on Nov. 3, 2008, which is the U.S. National Phase Application of International Application No. PCT/US2006/034171, filed on Aug. 31, 2006, which claims the benefit of U.S. Provisional Patent Application No. 60/712,413, filed on Aug. 31, 2005, entitled "Enhancement Of Stimulated Raman Lasing With Slow-Light Photonic Crystal Waveguides In Monolithic Silicon". The entire disclosures of the above-reference applications are hereby incorporated by reference herein in their entirety.

TECHNICAL FIELD

The disclosed subject matter relates to devices and methods for providing stimulated Raman lasing.

BACKGROUND

The area of silicon photonics has seen remarkable advancements in recent years. Subwavelength silicon nanostructures, such as photonic crystals and high-index-contrast photonic integrated circuits, offer the opportunity to fundamentally manipulate the propagation of light. The inherent ease of integration of a silicon photonics platform with complementary-metal-Oxide-semiconductor foundries also offers improved opportunities to reduce costs.

Stimulated Raman Scattering (SRS) is a phenomenon by which optical amplification can be performed. More particularly, it is an inelastic two-photon process, where a signal photon interacts with a pump photon to produce another signal photon and an excited state in a host material. For excited crystal silicon, longitudinal optical (LO) and transversal optical TO excited states (phonons) are formed. The SRS caused by the interaction of photons with the phonons of silicon produces Stokes and anti-Stokes light. The strongest Stokes peak arises from the single first order Raman-phonon at the center of the Brillouin zone. The generation of the Stokes photons can be understood classically as a third order nonlinear effect. Although significant gains in silicon photonics have been realized, improved mechanisms for performing SRS are desired.

SUMMARY OF THE INVENTION

Devices and methods for providing stimulated Raman lasing are provided in various embodiments of the disclosed subject matter.

In some embodiments, devices include a photonic crystal that includes a layer of silicon having a lattice of holes and a linear defect that forms a waveguide configured to receive pump light and output Stokes light through Raman scattering, wherein the thickness of the layer of silicon, the spacing of the lattice of holes, and the size of the holes are dimensioned to cause the photonic crystal to provide Raman lasing. In some embodiments, methods include forming a layer of silicon, and etching the layer of silicon to form a lattice of holes with a linear defect that forms a waveguide configured to receive pump light and output Stokes light through Raman scattering, wherein the thickness of the layer of silicon, the spacing of the lattice of holes, and the size of the holes are dimensioned to cause the photonic crystal to provide Raman lasing.

BRIEF DESCRIPTION OF THE DRAWINGS

Embodiments of the disclosed subject matter will be hereinafter described with reference to the accompanying drawings wherein:

FIG. 1A is a magnified view of a portion of FIG. 1.

FIG. 2A is a magnified view of a portion of FIG. 2.

FIG. 5 illustrates calculated electric and magnetic field intensity distributions in accordance with various embodiments of the disclosed subject matter.

FIG. 7 shows an example fiber coupling setup in accordance with various embodiments of the disclosed subject matter.

FIG. 12 shows a table of stimulated Raman gain enhancements in photonic crystal waveguide schemes in accordance with various embodiments of the disclosed subject matter.

DETAILED DESCRIPTION

As described below, devices and methods for providing stimulated Raman lasing are provided. The SRS effect can be used to develop an all silicon optical amplifier. Enhanced SRS through slow-light silicon photonic crystal waveguides (Ph-CWG) can serve as an ultra-compact on-chip gain media in various embodiments.

Photonic crystals (PC's) are materials, such as semiconductors, that prohibit the propagation of light within a frequency band gap because of an artificial periodicity in their refractive index. In two dimensional photonic crystals, a common way to achieve this artificial periodicity is to form a periodic lattice of holes, such as air holes (e.g., to have a lattice of air holes) in the material making up the photonic crystal (e.g., silicon).

Photonic crystals can also contain defects (e.g., cavities, or rows). These are locations within a lattice of holes where one or more holes are not present. These defects can be created using photolithography techniques. Photonic crystals can be seen as an optical analog of electronic crystals that exhibit band gaps due to periodically changing electronic potentials. By introducing a defect within a PC, one or more highly localized electromagnetic modes can be supported within the bandgap (analogous to impurity states in solid state devices). These defects can greatly modify the spontaneous emission of light from photonic crystals.

Figure 1:
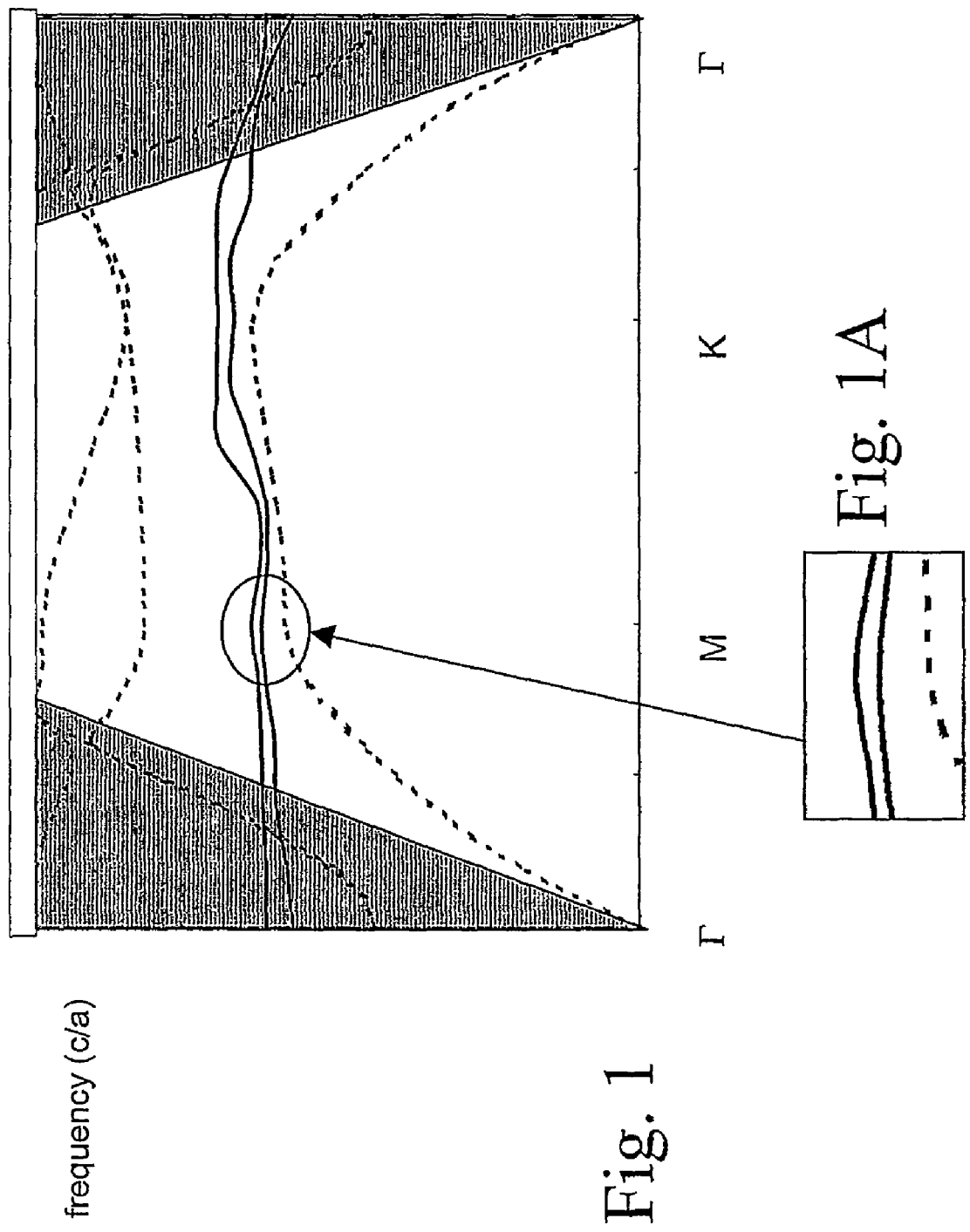
FIG. 1 illustrates a calculated band structure depicting possible guided modes in accordance with various embodiments of the disclosed subject matter.
Figure 2:
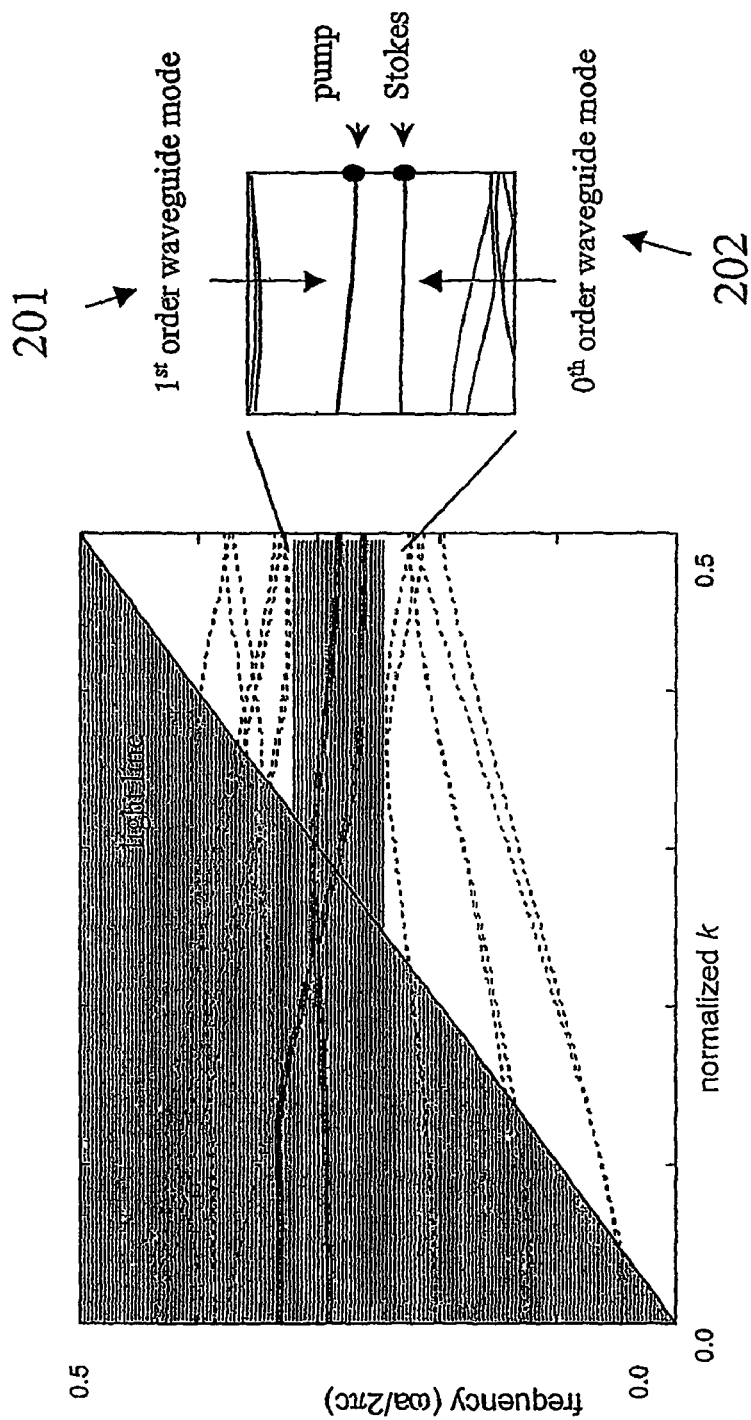
FIG. 2 illustrates a calculated band structure depicting possible guided modes in accordance with various embodiments of the disclosed subject matter.

In photonic crystal structures, line defects (e.g., a row of missing lattice holes) in the periodic lattice can form a waveguide that permits guided-mode bands within the waveguide's band gap, as shown in FIGS. 1 and 2. In various embodiments of the disclosed subject matter, these bands are designed to be as flat as possible to achieve slow-light behavior, as shown in FIGS. 1A and 2A. Group velocities as low as $10^{-3}$ c can be obtained (where "c" is the speed of light). Alternatively, coupled resonator optical waveguides can also permit control of the group velocity dispersion.

Figure 3:
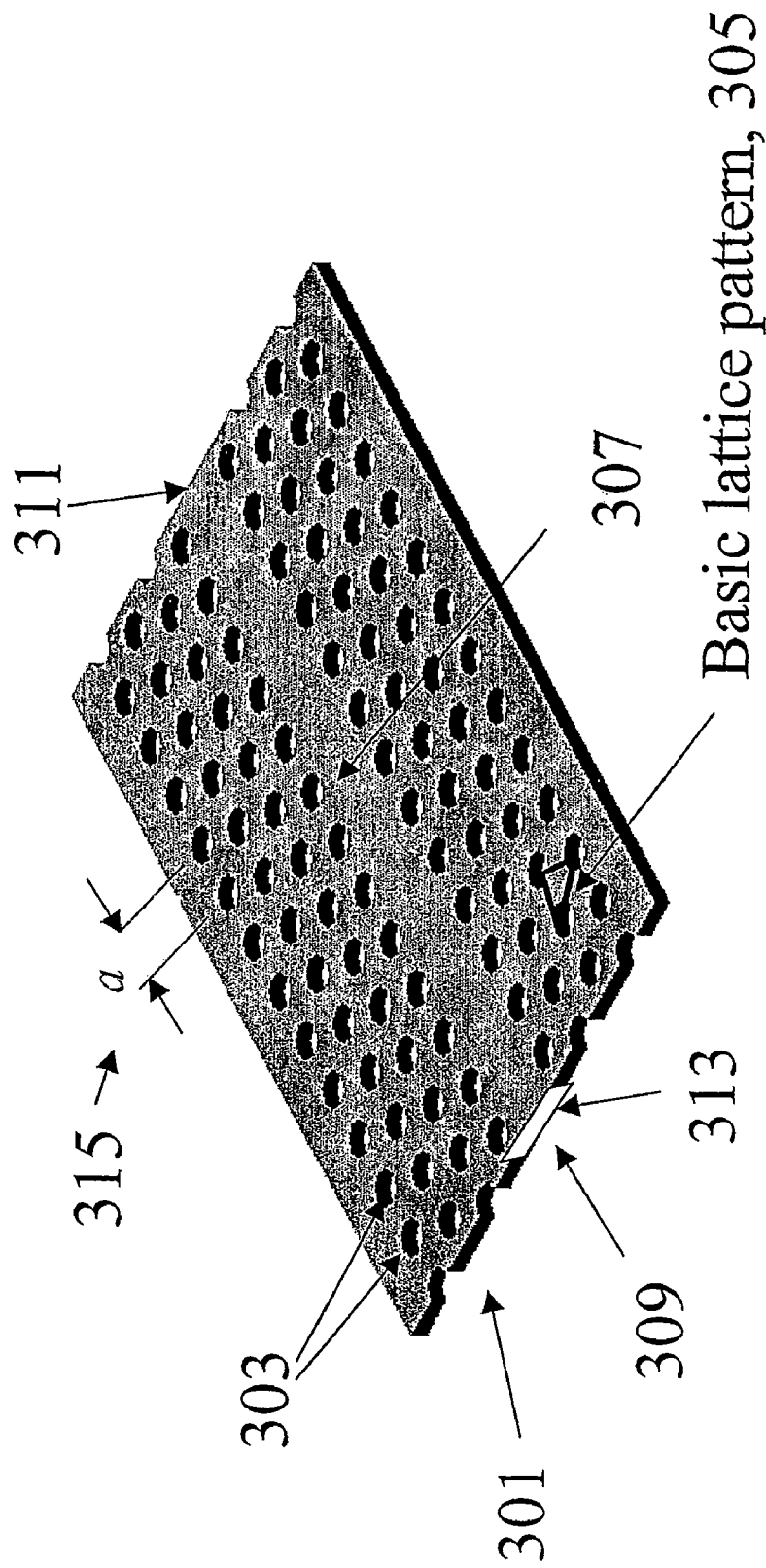
FIG. 3 shows a photonic crystal with a waveguide, in accordance with various embodiments of the disclosed subject matter.

An example of a photonic crystal 301 manufactured in accordance with various embodiments of the disclosed subject matter is illustrated in FIG. 3. In particular, the photonic crystal 301 can be formed from a layer of silicon on an insulator layer (e.g., a layer of oxide, $SiO_2$) (not shown). The layer of silicon can be formed by known semiconductor fabrication method. For example, the layer of silicon can be deposited or grown on the layer underneath it. In another example, a prefabricated wafer that has a silicon layer already formed on an oxide layer can be used. A lattice of air holes 303 can be formed by etching the silicon layer.

Although FIG. 3 illustrates the air holes having a circular cross sectional area, the air holes can also have other cross sectional areas (e.g., rectangular, ellipsoidal, etc.) in some embodiments. The air holes can have rough edges typically introduced during fabrication processes. The depth of the air holes can be substantially equal to the thickness of the silicon layer (e.g., 300 nm). However, the air holes can be shallower or deeper than the silicon layer. The etching of the silicon layer can be achieved by known methods (e.g., plasma etching, wet etching, etc.).

The lattice of holes can also form basic patterns 305. The example in FIG. 3 illustrates the basic lattice as having a triangular shape. However, the lattice can be formed using other basic patterns (e.g., squares, rectangles, pentagons, hexagons, etc.). The etching step can also create defects (e.g., areas with no holes) in the lattice. In FIG. 3, the defects form a line shaped hole-free region that is a pathway, which is an optical waveguide 307. Typically, an optical waveguide is an optically transparent or low attenuation material that is used for the transmission of signals with light waves. As used in connection with various embodiments of the disclosed subject matter, a waveguide can also be capable of lasing using Raman scattering.

The Raman scattering is further described using the example waveguide 307 shown in FIG. 3. A light pump (not shown) coupled to waveguide 307 supplies a beam of light (hereinafter the pump light) to an input port 309 of waveguide 307. The pump light has a pump frequency and a corresponding wavelength. As the pump light enters and travels to an output port 311 of waveguide 307, the pump light is down-shifted to become Stokes light, as well as causing phonons to appear. The production of Stokes light and phonons from the pump light is referred to as Raman scattering.

Figure 4:
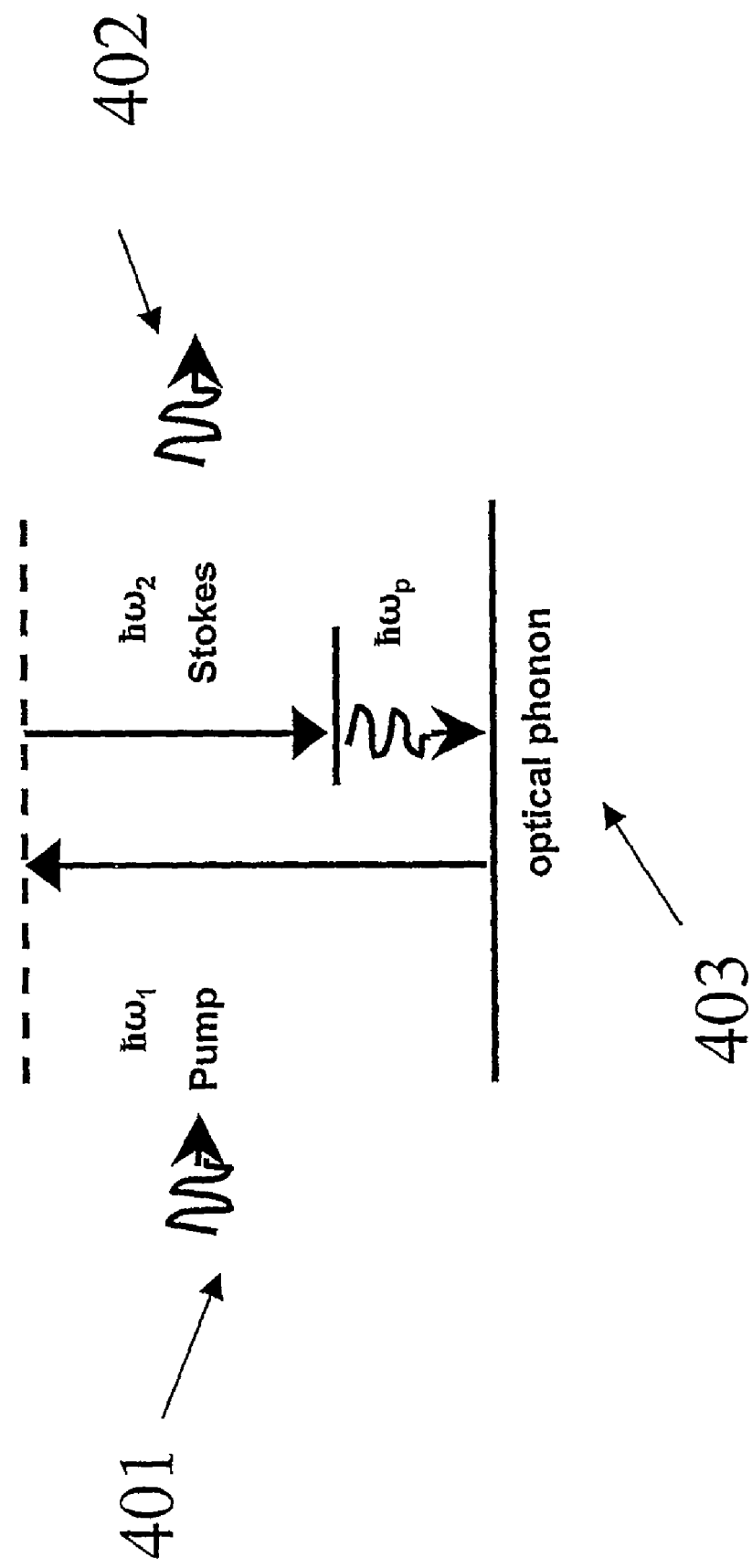
FIG. 4 illustrates a relationship between pump light, Stokes light, and phonons in Raman scattering in accordance with various embodiments of the disclosed subject matter.

FIG. 4 illustrates incoming pump light 401 being scattered by Raman scattering, and the subsequent generation of output Stokes light 402, and optical phonons 403.

Photonic crystals of various embodiments of the disclosed subject matter can have lengths (i.e., the distance between the input port 309 and output port 311), on the order of micrometers. For instance, the length can be between 2-3 micrometers. In some embodiments, the length can be 2.5 micrometers. However, the length can be shorter or longer than these example ranges depending on the overall design of each photonic crystal. Regarding the waveguide 307, its length (i.e., the distance between the input port 309 and output port 311) can be as co-extensive as that of the photonic crystal 301. A rectangular cross-sectional area 313 of the waveguide 307 perpendicular to the propagation direction of light in the waveguide 307 (i.e., from the input port 309 to the output port 311) can be on the order of sub-wavelength. Such a cross-sectional area is also referred to as a modal area. Here, sub-wavelength refers to lengths shorter than the wavelength of a light beam (either the pump light or the Stokes light), which is approximately 1.5 micrometers. In other words, each side of the rectangular cross-section 313 of the waveguide 307 can be shorter than the wavelength of a light beam. In some embodiments, the rectangular cross-sectional area can be on the order of sub-microns. This means each side of the rectangular cross-section of the waveguide can be shorter than a micron.

One possible design of a photonic crystal in accordance with some embodiments of the disclosed subject matter is an air-bridge triangular lattice photonic crystal slab (e.g., 301 of FIG. 3) with a thickness of 0.6 a and an air hole radius r of 0.29 a, where a 315 is the lattice spacing. The photonic band gap in this slab for transverse electric (TE)-like modes is around 0.25~0.32 [c/a].

Another possible design of a photonic crystal in accordance with some embodiments the disclosed subject matter is where only the Stokes mode is at slow group velocities. This can be realized as an air-bridge triangular lattice photonic crystal slab (e.g., 301 of FIG. 3) with a thickness of 0.6 a and an air hole radius r of 0.22 a, where a 315 is the lattice spacing. One possible lattice spacing a for this type of embodiment is 378 nm. Further details of an embodiment where only the Stokes mode is at slow group velocities is shown as Scheme 2 1202 in FIG. 12. A band structure for this type of embodiments is shown by 1004 in FIG. 10.

Tuning can be done using software for numerical computation of Maxell's equations, such as MIT Photonic Bands (MPB). MPB is able to compute the definite-frequency eigenstates of Maxwell's equations in a photonic crystal using a fully-vectorial, three-dimensional algorithm. MPB is further described in S. G. Johnson and J. D. Joannopoulos, Opt. Express, 8, 173 (2001), which is herein incorporated by reference in its entirety. Other numerical computation programs that can be used in accordance with various embodiments are RSoft developed by the RSoft Design Group Inc. of Ossining, N.Y. Another numerical computation program is called MEEP (a finite-difference time-domain simulation software package developed at MIT). A manual describing how to use an install and use MEEP is available at http://ab-initio.mit-.edu/wiki/index.php/Meep_manual.

In accordance with some embodiments, the numerical design process can be as follows: (1) fine-tune the PC waveguide geometry; (2) calculate resonant frequencies $f_{pump}$ and $f_{Stokes}$ with MPB; (3) calculate the lattice constant a based on the frequencies $(f_{pump}-f_{Stokes})(c/a)=15.6$ THz and calculate the wavelength $\lambda_{pump}=a/f_{pump}$, $\lambda_{Stokes}=a/f_{Stokes}$. For example, when a=420 nm, $(f_{pump}-f_{Stokes})=0.02184$, with a $\mu_{pump}=1550$ nm, $\lambda_{Stokes}=1686$ nm. FIG. 5 shows calculated electric and magnetic fields for various embodiments of the disclosed subject matter. The left side of FIG. 5 shows the electric field intensity $|E|^2$ and the magnetic field intensity $|H|^2$ at the middle of the slab for the pump mode ($1^{st}$ order waveguide mode) and the right side of FIG. 5 shows it for the Stokes mode ($0^{th}$ order waveguide mode).

By tuning the geometry of the PC waveguide, such as the size of holes, the waveguide width, and the slab thickness, the frequencies of the pump mode and Stokes mode can be shifted to match the pump-Stokes frequency spacing of 15.6 THz, corresponding to the optical phonon frequency of stimulated Raman scattering (SRS) in monolithic silicon.

FIG. 2 shows the projected band diagram of a PC waveguide calculated by MPB for the dimensions described above. Two defect waveguide modes, $0^{th}$ order 202 and $1^{st}$ order 201, exist in the bandgap of the 2D PC, and these waveguide modes show high density states and zero group velocities at the band edge due to the Bragg condition. The 1st order 201 and the $0^{th}$ order 202 waveguide modes at the band edge are considered to be the pump mode and the Stokes mode respectively.

Figures 6B, 6C:
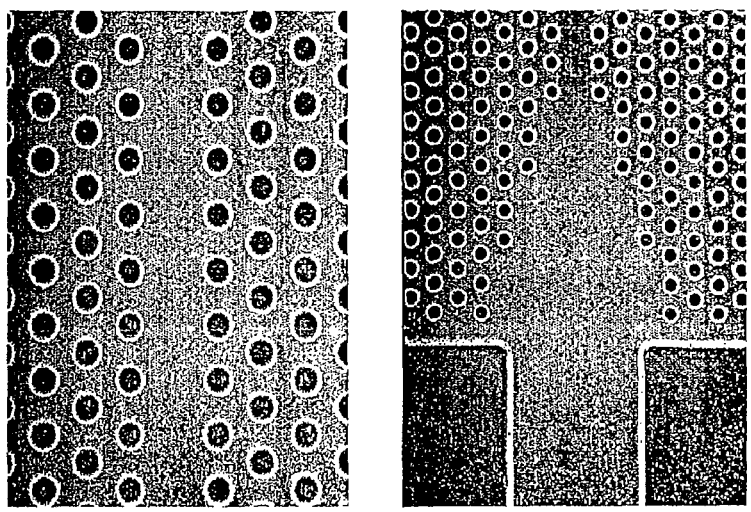
FIG. 6B shows a magnified view of a waveguide of a photonic crystal in accordance with various embodiments of the disclosed subject matter.
FIG. 6C shows a magnified view of an adiabatic coupling region between an input waveguide and a photonic crystal waveguide in accordance with various embodiments of the disclosed subject matter.
Figure 6A:
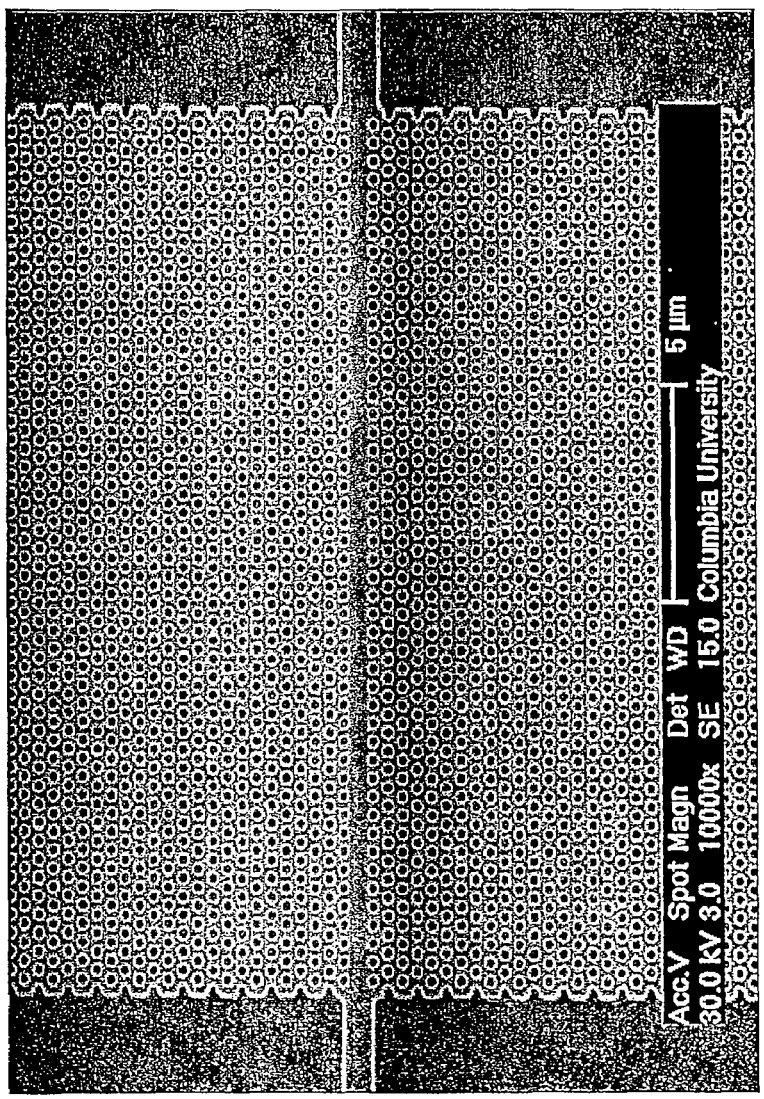
FIG. 6A shows a top view of a photonic crystal in accordance with various embodiments of the disclosed subject matter.

FIGS. 6A, 6B, and 6C show scanning electron microscope pictures of a PC waveguide fabricated using a silicon-on-insulator (SOI) substrate with a top silicon thickness of 320 nm. Various other silicon thicknesses can also be used. The desired pump-Stokes frequency spacing can be obtained by active trimming of the thickness of the photonic crystal using the same etching methods described above.

A potential area for loss for small group velocity ($v_g=d\omega/dk$) modes is the impedance and mode mismatch when coupling into these waveguides. In order to decrease the coupling loss between the conventional ridge waveguide and the PC waveguide (shown in detail in FIG. 6B), a taper structure for adiabatic mode transformation can be used as shown in FIG. 6C. FIG. 6C shows a coupling region between an input waveguide and a photonic crystal waveguide.

Figure 8:
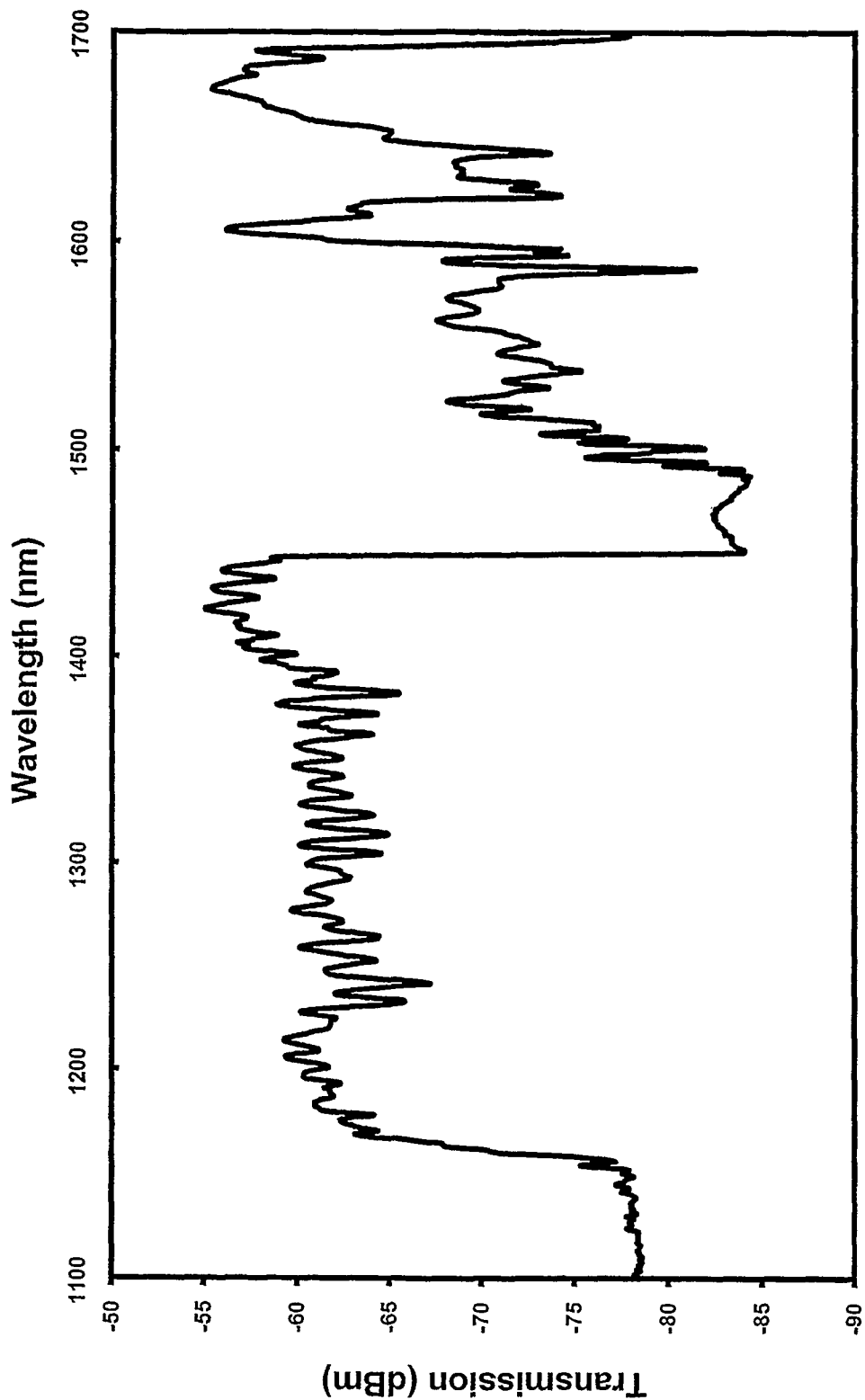
FIG. 8 is a graphical illustration of a transition spectrum of an example of a photonic crystal waveguide fabricated in accordance with various embodiments of the disclosed subject matter.

A UWS-1000 Supercontinuum laser from Santee USA Corporation of Hackensack, N.J., can be used to provide a measurement window from 1200 to 2000 nm. A polarization controller and a fiber-coupled lens assembly can be used to couple light into the taper structure. A second lensed fiber can be used to collect the waveguide output, and then the waveguide output can be sent to an optical spectrum analyzer. Such a fiber coupling setup can be as shown in FIG. 7. The measured transmission spectrum of a PC waveguide can be as given in FIG. 8. FIG. 8 represents the measured attenuation of different frequencies of light in a photonic crystal waveguide.

The amplification gain improved by the waveguides is further enhanced by integrating a p-i-n (p-type, intrinsic, n-type) junction diode with the photonic crystal. The junction diode is created by forming a p-type region with an n-type well alongside the waveguide on the photonic crystal. In such a configuration, the strong electrical field created by the diode can remove free carriers (electrons and holes). These free carriers, which are induced by two-photon absorption, can reduce, if not remove, the amplification gain factor in the photonic crystal. The p-i-n diode can be fabricated using known semiconductor fabrication methods. In operation, the diode can be biased by a constant voltage.

Figure 9:
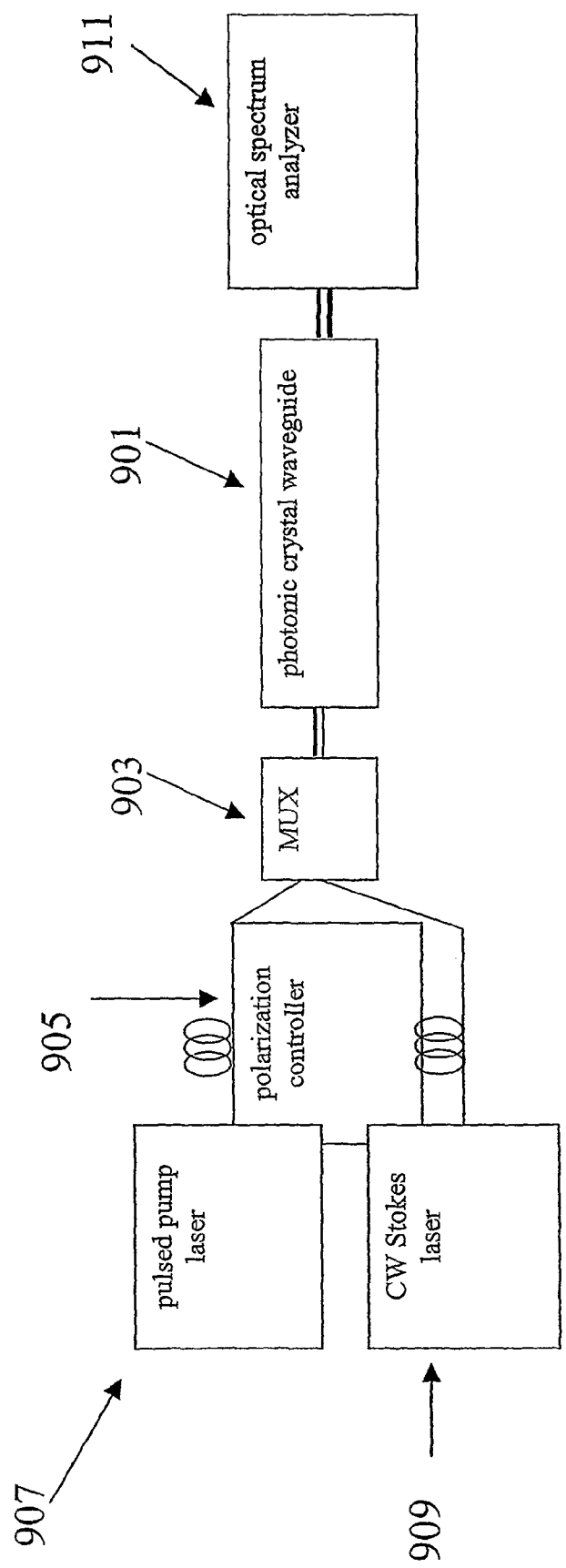
FIG. 9 is a block diagram illustrating various components for using pulsed pump light in various embodiments of the disclosed subject matter.

For various embodiments of the disclosed subject matter, in order to provide a net Raman gain, a two phonon absorption (TPA) induced free-carrier absorption phenomenon can be addressed using pulsed operations where the carrier lifetime is much larger than the pulse width and much less than the pulse period. In particular, as shown in FIG. 9, a photonic crystal waveguide 901 with one or more microcavities can be coupled to a multiplexer (MUX) 903. The MUX 903 can receive its input from a polarization controller 905 that combines inputs from a pulsed pump laser 907 and a continuous wave (CW) Stokes laser 909. The output from the photonic crystal 901 can then be input to an optical spectrum analyzer (e.g., a detector) 911.

Photonic crystals waveguides can be used for optical amplification and lasing because the small cross-sectional area 313 of a waveguide 307 causes optical field densities to increase and causes the gain of the Raman scattering and lasing to increase as well. Effects such as Rayleigh and Brillouin scattering, and surface state absorption can ultimately limit the maximum enhanced amplification and lasing output power.

The optical amplification and lasing properties of photonic crystal waveguides can be enhanced by taking advantage of the slow light phenomena. That is, at the photonic band edge, photons experience multiple reflections (photon localization) and move very slowly through the material structure. The photonic band edge is a 2D analog of the distributed feedback laser, but does require a resonant cavity. The lasing threshold is estimated to be proportional to $v_g^2$ ($v_g$ is the small group velocity) for operation at slow group velocity regions, arising from the enhanced stimulated emission and the increase in the reflection coefficient for small $v_g$. Group velocities as low as $10^{-2}$ c to $10^{-3}$ c have been experimentally demonstrated.

Figure 10:
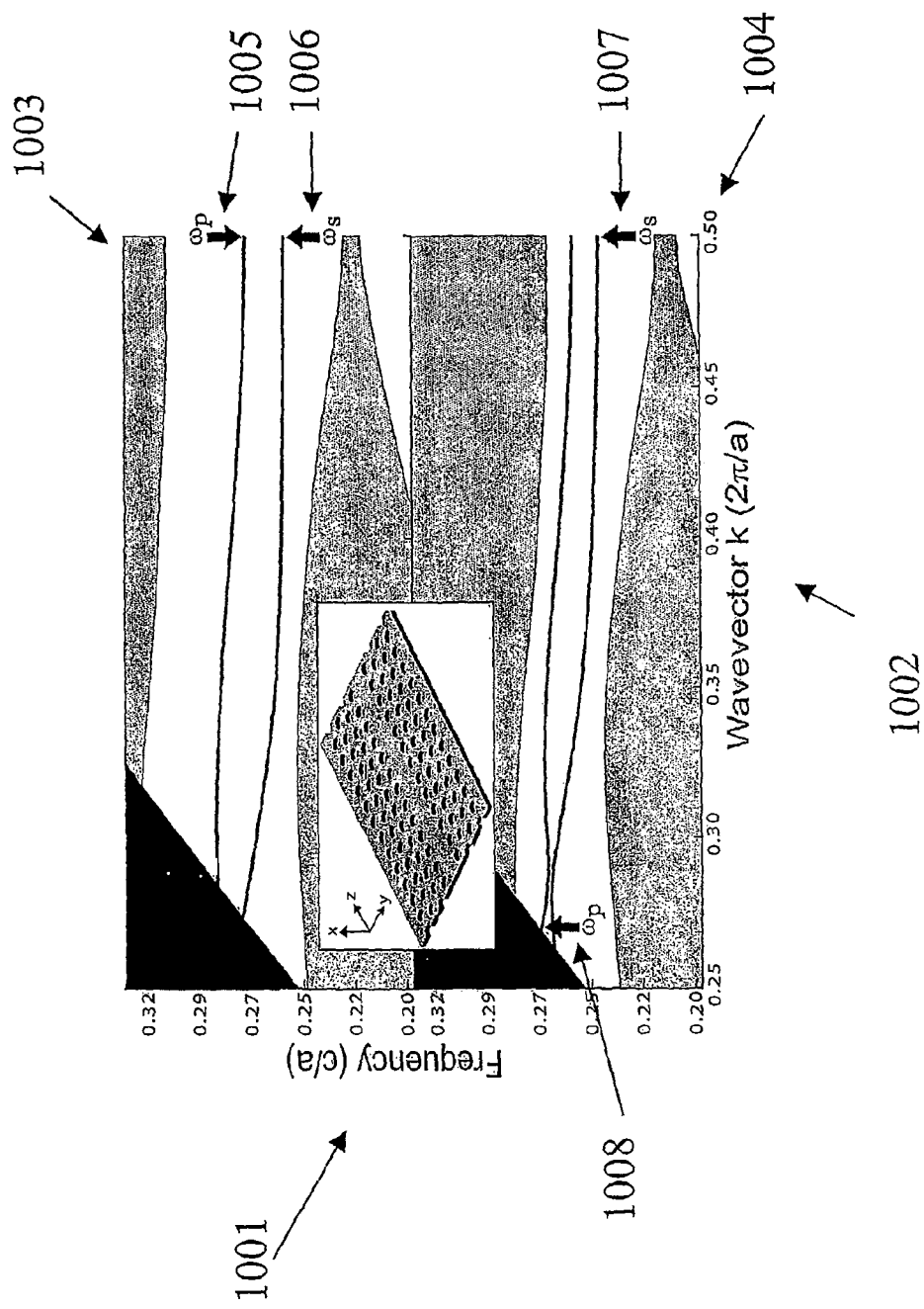
FIG. 10 shows a projected band structure of a silicon photonic crystal waveguide indicating pumps and Stokes frequencies in accordance with various embodiments of the disclosed subject matter.

Examples of a projected band structure can be seen in FIG. 10. FIG. 10 shows a photonic crystal 1003 with r/a=0.29 (Scheme 1). FIG. 10 also shows a photonic crystal 1004 with r/a=0.22 (Scheme 2). For both 1003 and 1004, h/a=0.6. As can be seen from the figure, Scheme 1 1003 supports two tightly confined modes 1005 and 1006 with small group velocities (shown by their relative flatness, or small $d\omega/dk$) within the bandgap. These are the pump mode and Stokes mode. Similarly, 1004 supports pump mode 1008 and Stokes mode 1007.

With slow group velocities, the interaction length can be reduced by $(v_g/c)^2$. In particular, for group velocities on the order of $10^{-2}$ c, interaction lengths, between the Stokes and pump modes, can be on the order of $10^4$ times smaller than conventional lasers. For the same operation power, the same gain can be obtained by the time-averaged Poynting power density P $(\sim v_g \in |E|^2)$ incident on the photonic crystal structure. A decrease in $v_g$ leads to a corresponding increase in $\in |E|^2$ and in the Raman gain coefficient.

Figures 11A, 11B:
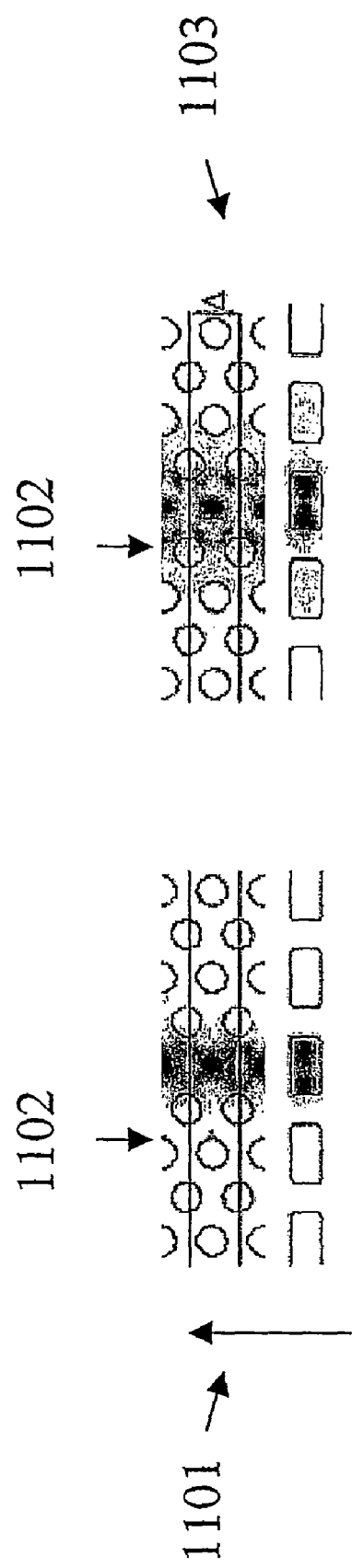
FIG. 11A shows a first calculated bound state of a hexagonal lattice photonic crystal waveguide with defect modes separated by the longitudinal optical/transversal optical phonon frequency spacing in silicon in accordance with various embodiments of the disclosed subject matter.
FIG. 11B shows a second calculated bound state of a hexagonal lattice photonic crystal waveguide with defect modes separated by the longitudinal optical/transversal optical phonon frequency spacing in silicon in accordance with various embodiments of the disclosed subject matter.

FIGS. 11A and 11B show the $|E|^2$ field distribution of examples of these two modes in a photonic crystal waveguide (r/a=0.29 and h/a=0.6). These are computed through the planewave expansion method using a numerical computation package like MPB.

SRS can be more mathematically described using a description that depicts the change in the average number of photons $n_s$ at the Stokes wavelength $\omega_s$ with respect to the longitudinal distance z:

$$\frac{dn_s}{dz} = (G_R - \alpha_s)n_S, \; G_R = \frac{dW_{fi}}{d\omega_s}(\rho_i - \rho_f)\frac{1}{\mu^{1/2}n_s}, \quad (1)$$

where $G_R$ is the Raman gain, $\alpha_s$ is an attenuation coefficient, $\mu$ is the permeability, $$\frac{dW_{fi}}{d\omega_s}$$

is the transition rate, and $\rho_i$ and $\rho_f$ are the initial and final state populations, respectively. For values of $n_s$ and $n_p$ (the average number of photons at $\omega_p$) significantly greater than 1, $$\frac{dW_{fi}}{d\omega_s} \propto n_s n_p$$

and thus the Raman gain $G_R$ is $\propto n_p$. For large values of $n_s$ and $n_p$, a mesoscopic classical description with Maxwell equations using nonlinear polarizations $P^{(3)}$ can also be used. The wave equations describing the interactions are:

$$\nabla \times (\nabla \times E_s) + \frac{1}{c^2}\frac{\partial^2}{\partial t^2}(\varepsilon_s E_s) = -\frac{1}{c^2}\frac{\partial^2}{\partial t^2}(P_s^{(3)}) \quad (2)$$

$$\nabla \times (\nabla \times E_p) + \frac{1}{c^2}\frac{\partial^2}{\partial t^2}(\varepsilon_p E_p) = -\frac{1}{c^2}\frac{\partial^2}{\partial t^2}(P_p^{(3)}). \quad (3)$$

Specifically, $P_s^{(3)}=\chi^{(3)jkmn}E_p E^*_p E_s$, where $\chi^{(3)jkmn}$ is the third-order fourth-rank Raman susceptibility with $\{j,k,m,n\}=\{x,y,z\}$. The resonant terms in $P_s^{(3)}$ give rise to SRS, while the non-resonant terms add to self-focusing and field-induced birefringence. The $E_p$ and $E_s$ are the electric fields at the pump and Stokes wavelengths, respectively. With $\chi^{(3)jkmn}$ obtained from bulk material properties, Equations (2) and (3) can be turned into discrete forms in the time-domain for direct ab initio numerical calculations of the nonlinear response.

As an approximation to the direct solution of this wave interpretation, the coupled-mode theory can be used to estimate the stimulated Raman gain. In particular, under the assumption of weak coupling between the pump and Stokes waves, the mode amplitudes can be given as:

$$\frac{\partial E_p}{\partial z} = -i\beta_{pp}I_p E_p \quad (4)$$

$$\frac{\partial E_s}{\partial z} = -i(\beta_{ps}(\omega_s)+\kappa_{ps}(\omega_s))I_p E_s - i(\beta_{pa}(\omega_s)+\kappa_{pa}(\omega_s))E_p^2 E_a^* e^{-i\Delta kz} \quad (5)$$

$$= -i(\beta_{pa}(\omega_a)+\kappa_{pa}(\omega_a))I_p E_a - i(\beta_{ps}(\omega_a)+\kappa_{ps}(\omega_a))E_p^2 E_s^* e^{-i\Delta kz} \quad (6)$$

where the self-coupling terms are neglected, $E_p$, $E_s$, and $E_a$ denote the pump, Stokes and anti-Stokes field amplitudes, respectively, and the pump and stokes intensities are $I_p=|E_p|^2$, $I_s=|E_p|^2$. $\beta_{ab}$ denotes the non-resonant terms and resonant terms with no frequency dependence. $\kappa_{ab}$ denotes the resonant overall coupling coefficients (integrated spatially) between the modes. By determining $\kappa_{ps}(\omega_s)$, Equations (4) and (5) can be employed to determine the SRS gain. Intrinsic loss due to two-photon absorption (TPA) is assumed to be small based on the measured TPA coefficients in silicon and at pump powers on the order of 1 Watt. The role of TPA-induced free carrier absorption can also be reduced in sub-wavelength silicon-on-insulator (SOI) waveguides of various embodiments of the disclosed subject matter due to significantly shorter lifetimes (compared to the recombination lifetimes). This results in lower overall carrier densities.

A specialized form of Equation (5) can be used to determine the Raman gain $G_R$ in waveguides, because $G_R$ has an approximate 1/(modal area)$^{3/4}$ dependence. See D. Dimitropoulos, B. Houshman, R. Claps, and B. Jalali, Optics Letters 28, 1954 (2003), which is hereby incorporated by reference herein in its entirety. That is, the SRS gain can increase with decreasing modal area 313, such as from high-index contrast waveguide structures.

An alternative way of describing the enhancement of SRS in a slow light photonic crystal waveguide is through a four wave mixing formalism from the computed pump and stokes modes of a photonic crystal waveguide. This can be mathematically modeled in bulk materials as a degenerate four wave mixing problem involving the pump and Stokes beams. One parameter is the third order nonlinear Raman Susceptibility, $\chi_R$. For silicon, $\chi_R$ is defined by the components $\chi_{1212}=-i\,\chi_R=-i11.2\times10^{-18}$ and $\chi_{1122}=-0.5\times\chi_{1212}$. These components, and their permutations as defined by the m3m crystal lattice, define SRS along the principle crystallographic axis of the silicon crystal, for example, in Silicon-on-Insulator wafers. The following description shall consider scattering in silicon along the [1$\bar{1}$0] direction, since practical devices can be fabricated along this direction to take advantage of the cleaving of silicon along this direction.

For bulk silicon, the evolution of the Stokes beam is defined by the paraxial nonlinear equation:

$$i\frac{\partial \vec{E}(\omega_s)}{\partial z} = -\frac{\omega_s^2}{2k_s\varepsilon_0 c^2}\vec{P}_R(\omega_s) \quad (7)$$

The solution of which is:

$$\frac{dI_s}{dz} = -\frac{3\omega_s Im(\chi_{eff}^R)}{\varepsilon_0 c^2 n_p n_s}I_p I_s \quad (8)$$

Equation (8) describes the gain of the Stokes wave in the bulk material. It shows the intrinsic dependence of the polarization and the phonon selection rules through $\chi_R$, and the intensity of the pump beam by $I_P$.

A PhCWG presents a very different field distribution than the bulk case. As shown in the computed modal profiles of FIG. 11A and FIG. 11B, the mode differs from that of a conventional channel waveguide in that it exhibits a periodic variation in the direction of propagation 1101. The modal distribution of the pump and Stokes modes in a Bloch-Floquet formalism with periodicity a, the lattice constant of the PhCWG, can be defined as:

$$\vec{E}_{n,k}(\vec{r},\omega)=e^{ik(w)\cdot\vec{r}}\vec{E}_{n,k}(\vec{r},\omega) \quad (9a)$$

$$\vec{E}_{n,k}(\vec{r}+\vec{\Delta},\omega)=e^{ik(w)\cdot\vec{\Delta}}\vec{E}_{n,k}(\vec{r},\omega) \quad (9b)$$

where $E_{n,k}$ is the modal distribution 1102 within a unit cell of the PC, as shown in FIGS. 11A and 11B. FIG. 11A shows the stokes mode ($0^{th}$ order waveguide mode) and FIG. 11B shows the pump mode ($1^{st}$ order waveguide mode). $\Delta$1103 defines the length of the unit cell in the direction of propagation 1101, and for the waveguide illustrated the length of the unit cell equals the PC lattice constant a.

The Lorentz Reciprocity Theorem can be used to develop an equation that relates the evolution of the Stokes mode to the pump mode:

$$\frac{\partial}{\partial z}\int_{A_\infty}\left[E_{n,k}^{*t}\times\tilde{H}_t+\tilde{E}_t\times H_{n,k}^{*t}\right]\cdot\hat{e}_z dA = i\omega\int_{A_\infty}P_R\cdot E_{n,k}^t dA \quad (10)$$

This relates the unperturbed PhCWG modes of the pump and Stokes wavelengths to those of the nonlinear induced fields. The envelopes of the fields are defined as:

$$\tilde{E}=u_s(z)E_{k(\omega_s)}(r;\omega_s)+u_p(z)E_{k(\omega_p)}(r;\omega_p) \quad (11a)$$

$$\tilde{H}=u_s(z)H_{k(\omega_s)}(r;\omega_s)+u_p(z)H_{k(\omega_p)}(r;\omega_p) \quad (11b)$$

with the assumption that the change in the Stokes field over the length of the unit cell of the waveguide is very small $$\left(|\Delta|\frac{du_{p,s}}{dz}<<1\right).$$

Taking the defined by the envelopes in Eqns. 11a and 11b, an expression for the Stokes beam envelope function, $u_s(z)$, is:

$$\frac{du_s(z)}{dz}=\frac{i\omega_s}{4P_0}\frac{1}{\Delta}\int_{V_0}P_R(\omega_s)\cdot E_{k(\omega_s)}(r,\omega_s)dr \quad (12a)$$

$$P_R(\omega_s)=\left[6\varepsilon_0\chi^R\vdots E_{k(\omega_p)}^*(r,\omega_p)E_{k(\omega_p)}(r,\omega_p)E_{k(\omega_s)}(r,\omega_s)\right]|u_p|^2 u_s \quad (12b)$$

The integral in Eqn. 12a can be taken over the volume ($V_0$) of the unit cell of the PhCWG mode. By normalizing the fields to a power $P_0$, the group velocity of the beams can be defined as:

$$v_g^{p,s}=\frac{\Delta P_0}{\frac{1}{2}\varepsilon_0\int_{V_0}\varepsilon(\vec{r})|\vec{E}(\vec{r},\omega_{p,s})|^2 d\vec{r}}. \quad (13)$$

with Eqns. 11a, 11b, and 13, and by rewriting Eqn. (12) in terms of intensity, the following resulting equation is produced that defines the intensity of the Stokes beam inside the PhCWG:

$$\frac{dI_s}{dz}=-\frac{3\omega_s}{\varepsilon_0 v_g^p v_g^s}KI_p I_s \quad (14)$$

$$\text{where } K=\frac{A_{\text{eff}}\,\text{Im}\left(\int_{V_0}E^*(\omega_s)\cdot\chi^R\vdots E^*(\omega_p)E(\omega_p)E(\omega_s)\right)}{\left(\frac{1}{2}\int_{V_0}\varepsilon(r)|E(\omega_p)|^2 dr\right)\left(\frac{1}{2}\int_{V_0}\varepsilon(r)|E(\omega_s)|^2 dr\right)} \quad (15)$$

and where $A_{\text{eff}}$ is defined as the average modal area across the volume $V_0$ $$A_{\text{eff}}=\left[\frac{\left(\int_{V_0}x^2|\vec{E}(\omega_s)|^2 d\vec{r}\right)\left(\int_{V_0}y^2|\vec{E}(\omega_s)|^2 d\vec{r}\right)}{\left(\int_{V_0}|\vec{E}(\omega_s)|^2 d\vec{r}\right)}\right]^{\frac{1}{2}} \quad (16)$$

The final resulting equation (Eqn. 14) shows the explicit inverse dependence the Stokes mode amplification has on the group velocities of the pump and Stokes beams.

FIG. 12 shows the results of Eqn. 14 being applied to the two different photonic crystal waveguide designs (the Scheme 1 and Scheme 2 mentioned above). The group velocities can be calculated from the slope (shown in FIG. 1A and FIG. 10) of the projected band structure. FIG. 1 shows the defect band structure for a silicon photonic crystal waveguide. Scheme 1 1201 involves utilizing both of the guided modes of the waveguide; odd-parity is the pump mode and even-parity is the Stokes mode. The wavelength separation of the modes at the edge of the Brilliion zone is matched to the LO/TO frequency separation of the pump and Stokes beams (e.g. 15.6 THz in silicon). Scheme 2 1202 utilizes a wide bandwidth PhCWG, in order for the Stokes and pump beams to exist both in the fundamental mode and below the light line. Rather then operating at the band edge, anomalous dispersion can be used to achieve lower group velocities than at the band edges in 2D periodic crystals with finite thicknesses.

From the results shown in FIG. 12, the Raman gain enhancement—proportional to $K/v_g^p v_g^s(v_g^s$ is shown by 1203, and $v_g^p$ is shown by 1204), is enhanced by approximately $5\times10^2$ [~554] times compared to channel waveguides based on a comparison of the respective group velocities. FIG. 12 shows a K value 1205 that is approximately the same order of magnitude as that in a conventional dielectric waveguide.

In addition, the reduction in K 1205 in Scheme 1 1201 as compared to Scheme 2 1202, is due to the lower modal overlap. However, the single mode Scheme 2 1202 operation has the disadvantage that only the Stokes mode 1203, but not the pump mode 1204, is at a low group velocity for enhanced Raman generation.

This above framework can be readily extended to include two photon and bulk free carrier absorption effects, which can limit the effective Raman gain in PhCWGs. However, these effects can be compensated for by using a pulsed-laser operation or by using p-i-n diodes to sweep the free-carriers.

Various embodiments and advantages of the disclosed subject matter are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and, accordingly, all suitable modifications and equivalents can be resorted to falling within the scope of the invention. Additionally, disclosed features from different embodiments can be combined with one another.

What is claimed is:

1. A method of manufacturing a photonic crystal waveguide for providing stimulated Raman lasing, comprising:
   forming a layer of silicon; and
   etching the layer of silicon to form a lattice of holes and a section which excludes the holes, such that the lattice of holes forms a waveguide configured to receive pump light and output Stokes light through Raman scattering, wherein a thickness of the layer of silicon, a spacing of the lattice of holes, and a size of the holes are dimensioned to cause the photonic crystal to provide Raman lasing.

2. The method of claim 1, wherein the thickness of the layer of silicon is within a range of about 240 nm to about 265 nm, the spacing of the holes is within a range of about 399 nm to about 441 nm, and the size of the holes is within a range of about 166 nm to about 122 nm.

3. The method of claim 1, wherein the thickness of the layer of silicon is within a range of about 216 nm to about 238 nm, the spacing of the holes is within a range of about 360 nm to about 400 nm, and the size of the holes is within a range of about 79 nm to about 87 nm.

4. The method of claim 3, wherein the waveguide is configured so that pump light of a chosen frequency will be in a slow group velocity mode of the waveguide.

5. The method of claim 3, wherein the slow group velocity mode has a slow group velocity as low as about $1/1000$ the speed of light.

6. The method of claim 5, wherein the wavelength of the selected frequency is about 1550 nm.

7. The method of claim 1, further comprising etching the lattice of holes, such that a triangular pattern is formed.

8. The method of claim 1, further comprising trimming the photonic crystal using etching techniques.

9. The method of claim 1, further comprising providing an adiabatic coupling region between an input waveguide and the lattice of holes forming a waveguide.

* * * * *